(12) United States Patent
Cheng

(10) Patent No.: US 11,322,723 B2
(45) Date of Patent: May 3, 2022

(54) PACKAGING STRUCTURE INCLUDING WATER-ABSORBING LAYER, DISPLAY COMPONENT AND DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 540 days.

(21) Appl. No.: 16/339,625

(22) PCT Filed: Oct. 18, 2018

(86) PCT No.: PCT/CN2018/110743
§ 371 (c)(1),
(2) Date: Apr. 4, 2019

(87) PCT Pub. No.: WO2019/196372
PCT Pub. Date: Oct. 17, 2019

(65) Prior Publication Data
US 2021/0367210 A1 Nov. 25, 2021

(30) Foreign Application Priority Data
Apr. 9, 2018 (CN) .......................... 201820497109.4

(51) Int. Cl.
*H01L 51/52* (2006.01)
(52) U.S. Cl.
CPC ...... *H01L 51/5259* (2013.01); *H01L 51/5246* (2013.01); *H01L 51/5253* (2013.01); *H01L 51/5256* (2013.01)

(58) Field of Classification Search
CPC ............. H01L 51/5259; H01L 51/5246; H01L 51/5253; H01L 51/5256
USPC .................................................... 257/40, 433
See application file for complete search history.

(56) References Cited

U.S. PATENT DOCUMENTS

| 2003/0184221 A1 | 10/2003 | Mishima |
| 2005/0269926 A1 | 12/2005 | Fukuoka et al. |
| 2008/0185960 A1* | 8/2008 | Koshiyama ......... H01L 51/5246 313/512 |

(Continued)

FOREIGN PATENT DOCUMENTS

| CN | 104124268 A | 10/2014 |
| CN | 104425548 A | 3/2015 |

(Continued)

OTHER PUBLICATIONS

International Search Report and Written Opinion for Application No. PCT/CN2018/110743, dated Jan. 16, 2019, 9 Pages.

(Continued)

*Primary Examiner* — Quoc D Hoang
(74) *Attorney, Agent, or Firm* — Brooks Kushman P.C.

(57) ABSTRACT

A packaging structure, a display component and a display device are provided by the present disclosure. The packaging structure includes: a substrate; a light-emitting unit arranged on the substrate; a packaging layer, by which the light-emitting unit is packaged on the substrate; and a water-absorbing layer which is arranged in the packaging layer and completely wrapped by the packaging layer.

9 Claims, 3 Drawing Sheets

(56) References Cited

U.S. PATENT DOCUMENTS

| | | | |
|---|---|---|---|
| 2014/0132148 A1* | 5/2014 | Jang | H01L 51/5246 313/504 |
| 2015/0060780 A1 | 3/2015 | Hsu et al. | |
| 2016/0293886 A1 | 10/2016 | Yu et al. | |
| 2016/0365537 A1 | 12/2016 | Qian | |
| 2019/0067639 A1 | 2/2019 | Jiang et al. | |
| 2019/0198814 A1 | 6/2019 | Ge | |

FOREIGN PATENT DOCUMENTS

| | | |
|---|---|---|
| CN | 104505468 A | 4/2015 |
| CN | 105098091 A | 11/2015 |
| CN | 105280839 A | 1/2016 |
| CN | 106935732 A | 7/2017 |
| CN | 107464888 A | 12/2017 |
| CN | 107565052 A | 1/2018 |
| JP | 2003323975 A | 11/2003 |
| JP | 2005340020 A | 12/2005 |
| JP | 2007042616 A | 2/2007 |
| JP | 2007141685 A | 6/2007 |
| JP | 2007250459 A | 9/2007 |
| JP | 2013229202 A | 11/2013 |

OTHER PUBLICATIONS

First Office Action for Japanese Application No. 2019-566804, dated Sep. 1, 2021, 4 Pages.
First Office Action for Indian Application No. 201947045012, dated Oct. 7, 2021, 5 Pages, including English Translation.

* cited by examiner

PACKAGING STRUCTURE INCLUDING WATER-ABSORBING LAYER, DISPLAY COMPONENT AND DISPLAY DEVICE

CROSS-REFERENCE TO RELATED APPLICATION APPLICATIONS

This application is the U.S. national phase of PCT Application No. PCT/CN2018/110743 filed on Oct. 18, 2018, which claims priority to Chinese Patent Application No. 201820497109.4 filed on Apr. 9, 2018, which are incorporated herein by reference in their entireties.

The present application claims the priority of the Chinese patent application No. 201820497109.4 filed in China on Apr. 9, 2018, a disclosure of which is incorporated herein by reference in its entirety.

TECHNICAL FIELD

The present disclosure relates to the field of packaging technology, and in particular, relates to a packaging structure, a display component and a display device.

BACKGROUND

Along with the development of the display technology, display devices such as notebook computers, mobile phones, televisions, and displays are rapidly growing in the market. Organic Light-Emitting Diode (OLED) and Quantum Dot Light Emitting Diodes (QLED) are receiving more and more attention as emerging display components. A light-emitting unit in an OLED packaged component mainly includes an anode, a cathode, and an organic light-emitting layer. Under an electric field applied to the organic light-emitting layer, holes are injected into the organic light-emitting layer from the anode, electrons are injected into the organic light-emitting layer from the cathode, the holes and the electrons meet in the organic light-emitting layer to form excitons, and the excitons illuminate and jump to a low energy level. A light-emitting unit in the QLED packaging component mainly includes quantum dots (also known as semiconductor nanocrystals). The quantum dots are stimulated by light or electricity and emit colored light. The color of the light is determined by the composition and size of the quantum dots.

In the related art, the problem of the OLED display component and the QLED display component is that, since a light-emitting layer in the OLED display component is an organic material and a light-emitting layer in the QLED display component is an inorganic nanomaterial, it is easy to deteriorate the properties of the display component to affect a display quality in the case that the organic material and the inorganic nanomaterial encounter water and oxygen. Therefore, it is necessary to further improve the ability of resisting water and oxygen permeation of the OLED display component and the QLED display component.

SUMMARY

Technical solutions are provided by the present disclosure as followed.

In a first aspect, a packaging structure provided by embodiments of the present disclosure includes:

a substrate;

a light-emitting unit arranged on the substrate;

a packaging layer, by which the light-emitting unit is packaged on the substrate; and a water-absorbing layer which is arranged in the packaging layer and completely wrapped by the packaging layer.

Optionally, the packaging layer includes:

an inorganic film covering the light-emitting unit and an encapsulant layer covering the inorganic film;

the packaging layer further includes a packaging covering plate; the encapsulant layer is adhered between the packaging covering plate and the substrate;

the water-absorbing layer is arranged on a surface of the packaging covering plate facing the substrate, and is completely wrapped by the packaging covering plate and the encapsulant layer.

Optionally, the packaging layer includes:

a multi-layer composite packaging film covering the light-emitting unit; the multi-layer composite packaging film includes at least one organic film and at least two inorganic films; the organic film and the inorganic film are arranged alternately; and an encapsulant layer covering the multi-layer composite packaging film;

the packaging layer further includes a packaging covering plate, and the encapsulant layer is adhered between the packaging covering plate and the substrate;

the water-absorbing layer is arranged on a surface of the packaging covering plate facing the substrate, and is completely wrapped by the packaging covering plate and the encapsulant layer.

Optionally, the packaging layer includes:

a multi-layer composite packaging film covering the light-emitting unit; the multi-layer composite packaging film comprises at least one organic film and at least two inorganic films; the organic film and the inorganic film are arranged alternately; and an encapsulant layer covering the multi-layer composite packaging film;

the packaging layer further comprises a packaging covering plate, and the encapsulant layer is adhered between the packaging covering plate and the substrate;

the water-absorbing layer is arranged between the organic film and the inorganic film, and is completely wrapped by the organic film and the inorganic film.

Optionally, the packaging layer includes:

a multi-layer composite packaging film covering the light-emitting unit; the multi-layer composite packaging film includes at least one organic film and at least two inorganic films; the organic film and the inorganic film are arranged alternately; and an encapsulant layer covering the multi-layer composite packaging film;

the packaging layer further includes a packaging covering plate, and the encapsulant layer is adhered between the packaging covering plate and the substrate;

the water-absorbing layer has two layers, one layer of the water-absorbing layer is arranged between the organic film and the inorganic film, and is completely wrapped by the organic film and the inorganic film, and the other layer of the water-absorbing layer is arranged on a surface of the packaging covering plate facing the substrate, and is completely wrapped by the packaging covering plate and the encapsulant layer.

Optionally, the water-absorbing layer includes a base layer and a moisture absorbent located in the base layer.

Optionally, a material of the base layer is the same as or different from a material of the encapsulant layer.

Optionally, the water-absorbing layer is provided with a plurality of grooves, the water-absorbing layer is divided into a plurality of water-absorbing regions spaced apart by the grooves, and the grooves are filled with sealant.

Optionally, the light-emitting unit is an OLED light-emitting unit or a QLED light-emitting unit.

In a second aspect, a display component provided by embodiments of the present disclosure includes the packaging structure described above.

In a third aspect, a display device provided by embodiments of the present disclosure includes the display component described above.

DETAILED DESCRIPTION

Figure 1:
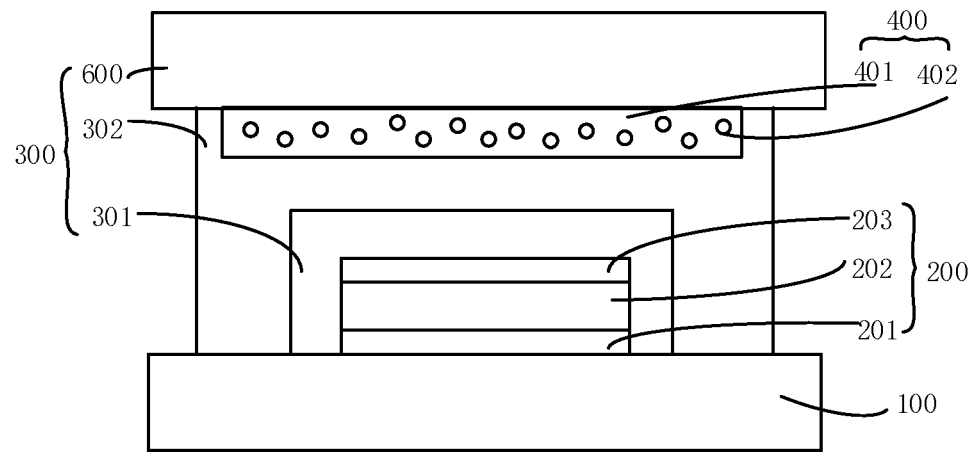
FIG. 1 is a schematic structural view showing a first embodiment of a packaging structure provided by the present disclosure.

In order to make the objects, technical solutions and advantages of the embodiments of the present disclosure more clear, the technical solutions of the embodiments of the present disclosure will be clearly and completely described below in conjunction with the drawings of the embodiments of the present disclosure. It is apparent that the described embodiments are a part of the embodiments of the present disclosure, rather than all of them. Based on the described embodiments of the present disclosure, other embodiments obtained by those skilled in the art without creative effort shall fall within the protective scope of the disclosure.

In view of a problem that when water and oxygen enter a light-emitting unit of a display component in the related art, the property of the display device is deteriorated and the display quality is affected, a packaging structure, a display component and a display device are provided by embodiments of the present disclosure, which are capable of effectively reducing an adverse effect of the water and oxygen on a packaging component.

As shown in FIGS. 1 through 6, a packaging structure provided by embodiments of the present disclosure includes:

a substrate 100;

a light-emitting unit 200 arranged on the substrate 100;

a packaging layer 300, by which the light-emitting unit 200 is packaged on the substrate 100; and a water-absorbing layer 400 which is arranged in the packaging layer 300 and completely wrapped by the packaging layer 300.

In the above embodiment, since the water-absorbing layer 400 is arranged in the packaging layer 300 of the packaging structure, the water-absorbing layer 400 can absorb the water and oxygen entering the packaging layer 300, thereby effectively preventing moisture and oxygen from penetrating into the light-emitting unit 200, providing a good protecting effect and avoiding display defect. The water-absorbing layer 400 is wrapped by the packaging layer 300, which can prevent the water and oxygen outside the display device from directly entering the water-absorbing layer, so as to maintain a function of the water-absorbing layer for a long time.

It should be noted that, in the above embodiment, the water-absorbing layer 400 is completely wrapped by the packaging layer 300, which means that the water-absorbing layer 400 is completely wrapped inside the packaging layer 300 without being exposed to the outside of the packaging layer 300. In this way, the water-absorbing layer 400 can be prevented from absorbing the external water vapor.

In the embodiments of the present disclosure, the packaging structure may be a variety of light-emitting component packaging structures. For example, the packaging structure may be an OLED (Organic Light-Emitting Diode) packaging structure. In this case, the light-emitting unit 200 is an OLED light-emitting unit. The packaging structure may also be an QLED (Quantum Dot Light Emitting Diodes) packaging structure. In this case, the light-emitting unit 200 is an QLED light-emitting unit.

Schematically, as shown in FIG. 1, the OLED light-emitting unit may include a first electrode layer 201, an organic light-emitting layer 202, and a second electrode layer 203 sequentially arranged on the substrate 100. The first electrode layer 201 is an anode, the second electrode layer 203 is a cathode, or the first electrode layer 201 is a cathode, and the second electrode layer 203 is an anode.

In addition, the OLED light-emitting unit may further include a hole transmitting layer, an electron transmitting layer, and the like. The specific structure of the OLED light-emitting unit is merely exemplified herein and is not limited thereto.

Figure 6:
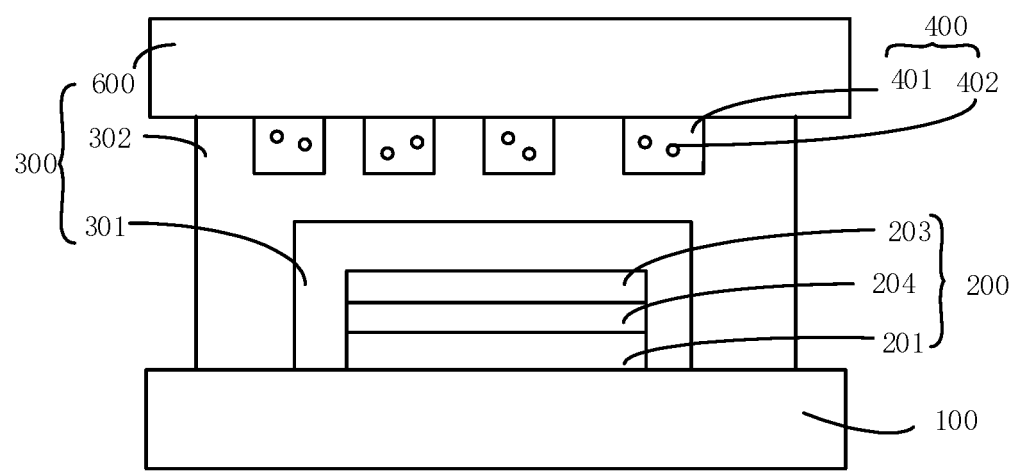
FIG. 6 is a schematic structural view showing a sixth embodiment of a packaging structure provided by the present disclosure.

The QLED light-emitting element may be an electroluminescence structure or photoluminescence structure. Schematically, as shown in FIG. 6, the QLED light-emitting unit may include a first electrode layer 201, a quantum dot light-emitting layer 204 and a second electrode layer 203 sequentially arranged on the substrate 100. The first electrode layer 201 is an anode, the second electrode layer 203 is a cathode, or the first electrode layer 201 is a cathode, and the second electrode layer 203 is an anode. In addition, the QLED light-emitting unit may further include a hole transmitting layer, an electron transmitting layer, and the like. The specific structure of the QLED light-emitting unit is merely exemplified herein and is not limited thereto.

Several exemplary embodiments of the packaging structure in the embodiments of the present disclosure are provided as followed.

First Embodiment

Figure 5:
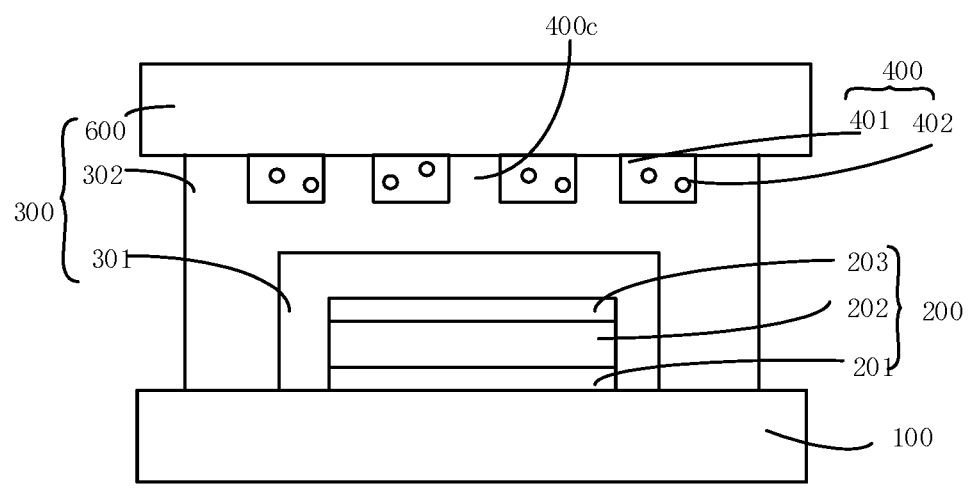
FIG. 5 is a schematic structural view showing a fifth embodiment of a packaging structure provided by the present disclosure.

FIG. 1 and FIG. 5 are schematic structural views showing the packaging structure in the first embodiment of the present disclosure. As shown in FIG. 1 and FIG. 5, the packaging structure provided by the present embodiment includes:

a substrate 100;

a light-emitting unit 200 arranged on the substrate 100;

a packaging layer 300, by which the light-emitting unit 200 is packaged on the substrate 100; and a water-absorbing layer 400 which is arranged in the packaging layer 300 and completely wrapped by the packaging layer 300;

in which the packaging layer 300 includes: an inorganic film 301 covering the light-emitting unit 200 and an encapsulant layer 302 covering the inorganic film 301; the packaging layer 300 further includes a packaging covering plate 600; the encapsulant layer 302 is adhered between the packaging covering plate 600 and the substrate 100; the water-absorbing layer 300 is arranged on a surface of the packaging covering plate 600 facing the substrate 100, and is completely wrapped by the packaging covering plate 600 and the encapsulant layer 302.

The inorganic film 301 may be made of at least one material selected from a silicon oxide, a silicon nitride, and an aluminum oxide, but is not limited thereto. The inorganic film 301 can be formed by sputtering and CVD (Chemical Vapor Deposition).

A material of the encapsulant layer 302 may be a heat-curing resin or a photo-curing resin. For example, the encapsulant layer 302 may be made of epoxy polymer, olefin based polymer or the like.

The water-absorbing layer 400 may include a base layer 401 and a moisture absorbent 402 located in the base layer 401. The material of the base layer 401 is also made of curable resin, which may be the same as or different from the material of the encapsulant layer 302. The moisture absorbent 402 may adsorb or remove the moisture or the oxygen by physical effect or chemical reaction. For example, an alumina, a calcium oxide, a cerium oxide, a magnesium oxide, a sodium sulfate, a calcium sulfate, a calcium chloride, a magnesium chloride, a silica, a zeolite, or a titanium dioxide can be used.

The packaging covering plate 600 may be made of glass, polymer or metal.

The substrate 100 may be made of glass or a polymer. In the case that the substrate 100 is made of polymer, for example, polyimide, the substrate 100 may be a flexible substrate.

For manufacturing the packaging structure provided by the present embodiment, firstly, the light-emitting unit 200 and the inorganic film 301 are formed on the substrate 100; the water-absorbing layer 400 is formed on the packaging covering plate 600 and cured; then an encapsulant layer 302 is formed on the packaging covering 600, and the water-absorbing layer 400 is completely covered by the encapsulant layer 302; the packaging covering plate 600 is attached to the substrate 100; the encapsulant layer 302 is cured to complete the package.

In addition, an exemplary structure of the water-absorbing layer 400 is further provided by the present embodiment.

As shown in FIG. 5, the water-absorbing layer 400 is provided with a plurality of grooves 400c, the water-absorbing layer 400 is divided into a plurality of water absorbing regions by the grooves 400c, and the grooves 400c are filled with sealant.

According to the above embodiment, the plurality of the water-absorption regions is spaced apart by the grooves 400c. That is, each of the water-absorbing regions is a separated water-absorbing block, and the grooves 400c divide the water-absorbing layer 400 into a plurality of water-absorbing blocks spaced apart from each other. Thus, the adhesion between the water-absorbing layer 400 and the encapsulant layer 302, and between the packaging covering plate 600 and the encapsulant layer 302 can be improved.

Schematically, the water-absorbing layer 400 can be formed using printing process.

Second Embodiment

Figure 2:
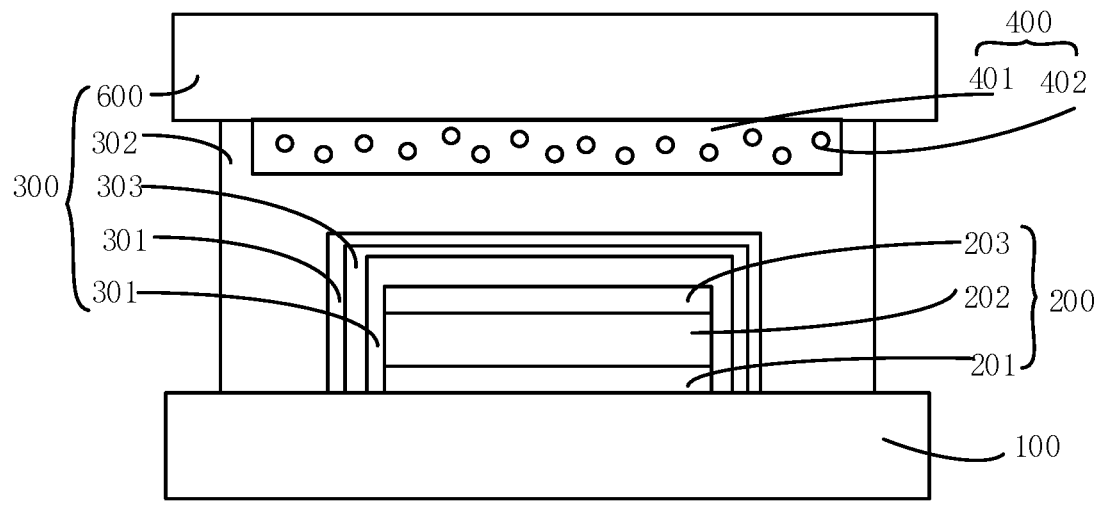
FIG. 2 is a schematic structural view showing a second embodiment of a packaging structure provided by the present disclosure.

FIG. 2 is a schematic structural view showing the packaging structure in the second embodiment of the present disclosure. As shown in FIG. 2, the packaging structure provided by the present embodiment includes:

a substrate 100;

a light-emitting unit 200 arranged on the substrate 100;

a packaging layer 300, by which the light-emitting unit 200 is packaged on the substrate 100; and a water-absorbing layer 400 which is arranged in the packaging layer 300 and completely wrapped by the packaging layer 300;

the packaging layer 300 includes: a multi-layer composite packaging film covering the light-emitting unit 200, wherein the multi-layer composite packaging film includes at least one organic film 303 and at least two inorganic films 301, and the organic film 303 and the inorganic film 301 are arranged alternately; and an encapsulant layer 302 covering the multi-layer composite packaging film; the packaging layer 300 further includes a packaging covering plate 600, and the encapsulant layer 302 is adhered between the packaging covering plate 600 and the substrate 100; the water-absorbing layer 400 is arranged on a surface of the packaging covering plate 600 facing the substrate 100, and is completely wrapped by the packaging covering plate 600 and the encapsulant layer 302. In the present embodiment, the material of the inorganic film 301, the encapsulant layer 302, the base layer 401 of the water-absorbing layer 400 and the moisture absorbent 402 can be the same as the embodiment 1, and details thereof are not described herein.

A material of the organic film 303 may be an epoxy resin, an acrolein-based resin, a polyimide resin, or a combination thereof. The organic film 303 can be made by depositing the above organic materials by spin coating, spray coating, screen printing, ink jet, or the like.

In addition, in the present embodiment, the structure of the water-absorbing layer 400 can be the same as that of the water-absorbing layer 400 described in the first embodiment, and details thereof are not described herein.

Third Embodiment

Figure 3:
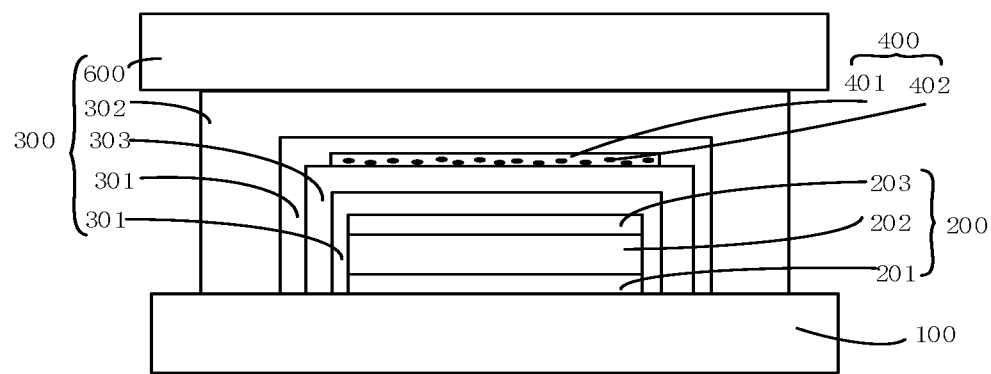
FIG. 3 is a schematic structural view showing a third embodiment of a packaging structure provided by the present disclosure.

FIG. 3 is a schematic structural view showing the packaging structure in the third embodiment of the present disclosure. As shown in FIG. 3, the packaging structure provided by the present embodiment includes:

a substrate 100;

a light-emitting unit 200 arranged on the substrate 100;

a packaging layer 300, by which the light-emitting unit 200 is packaged on the substrate 100; and a water-absorbing layer 400 which is arranged in the packaging layer 300 and completely wrapped by the packaging layer 300;

the packaging layer 300 includes: a multi-layer composite packaging film covering the light-emitting unit 200, wherein the multi-layer composite packaging film comprises at least one organic film 303 and at least two inorganic films 301, and the organic film 303 and the inorganic film 301 are arranged alternately; and an encapsulant layer 302 covering the multi-layer composite packaging film; the packaging layer 300 further includes a packaging covering plate 600, and the encapsulant layer 302 is adhered between the packaging covering plate 600 and the substrate 100; the water-absorbing layer 400 is arranged between the organic film 303 and the inorganic film 301, and is completely wrapped by the organic film 303 and the inorganic film 301.

In the embodiment, materials of the organic film 303, the inorganic film 301, the encapsulant layer 302, the base layer 401 of the water-absorbing layer 400 and the moisture absorbent 402 can be the same as those in the second embodiment, and details thereof are not described herein.

The water-absorbing layer 400 can be formed on the organic film 303 by printing.

Fourth Embodiment

Figure 4:
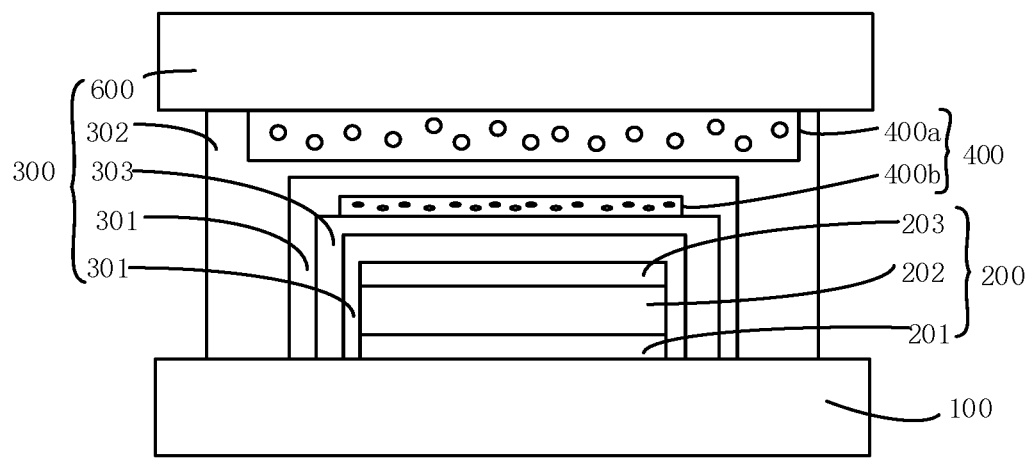
FIG. 4 is a schematic structural view showing a fourth embodiment of a packaging structure provided by the present disclosure.

FIG. 4 is a schematic structural view showing the packaging structure in the fourth embodiment of the present disclosure. As shown in FIG. 4, the packaging structure provided by the present embodiment includes:

a substrate 100;

a light-emitting unit 200 arranged on the substrate 100;

a packaging layer 300, by which the light-emitting unit 200 is packaged on the substrate 100; and a water-absorbing layer 400 which is arranged in the packaging layer 300 and completely wrapped by the packaging layer 300;

the packaging layer 300 includes: a multi-layer composite packaging film covering the light-emitting unit 200, wherein the multi-layer composite packaging film includes at least one organic film 303 and at least two inorganic films 301, and the organic film 303 and the inorganic film 301 are arranged alternately; and an encapsulant layer 302 covering the multi-layer composite packaging film; the packaging layer 300 further includes a packaging covering plate 600, and the encapsulant layer 302 is adhered between the packaging covering plate 600 and the substrate 100; the water-absorbing layer 400 includes a water-absorbing layer 400a and water-absorbing layer 400b, in which the water-absorbing layer 400a is arranged between the organic film 303 and the inorganic film 301, and is completely wrapped by the packaging covering plate 600 and the encapsulant layer 302; the water-absorbing layer 400b is arranged on a surface of the packaging covering plate 600 facing the substrate 100, and is completely wrapped by the organic film 303 and the inorganic film 301.

In the present embodiment, materials of the organic film 303, the inorganic film 301, the encapsulant layer 302, the base layer of the water-absorbing layer 400a, 400b and the moisture absorbent can be the same as those in the third embodiment, and details are not described herein.

In addition, in the present embodiment, the structure of the water-absorbing layer 400a covered by the packaging covering plate 600 and the encapsulant layer 302 completely can be the same as the structure of the water-absorbing layer 400 described in embodiment 1, and details thereof are not described herein.

Several exemplary embodiments of the packaging structure provided by the embodiments of the present disclosure are provided above. In practical applications, the specific implementation of the packaging structure is not limited to the above embodiments.

In addition, a display component provided by embodiments of the present disclosure includes the packaging structure provided in the embodiments of the present disclosure. The display component provided by the embodiments of the present disclosure may be an OLED display component, a QLED display component, or the like. Of course, it should be understand that the display component can also be other types of display components, and is not limited thereto.

In addition, a display device provided by embodiments of the present disclosure includes the display component provided by the embodiments of the present disclosure. The display device provided by the embodiments of the present disclosure may be a variety of display devices, such as a mobile phone, a computer, a panel computer, a television, a wearable device, and the like.

It is apparently that the display component and the display device provided by the embodiments of the present disclosure also have the beneficial effects brought by the packaging structure provided by the embodiments of the present disclosure.

The above embodiments are merely specific embodiments, but the protection scope of the present disclosure is not limited thereto. Any changes or substitutions that are obvious to those skilled in the art within the scope disclosed by the present disclosure are intended to be included within the scope of the present disclosure. Therefore, the protection scope of the present disclosure should be determined by the scope of the claims.

What is claimed is:

1. A packaging structure, comprising:
a substrate;
a light-emitting unit arranged on the substrate;
a packaging layer, by which the light-emitting unit is packaged on the substrate; and
a water-absorbing layer which is arranged in the packaging layer and completely wrapped by the packaging layer,
wherein the packaging layer comprises:
a multi-layer composite packaging film covering the light-emitting unit; wherein the multi-layer composite packaging film comprises at least one organic film and at least two inorganic films; the organic film and the inorganic films are arranged alternately; and
an encapsulant layer covering the multi-layer composite packaging film;
the packaging layer further comprises a packaging covering plate, and the encapsulant layer is adhered between the packaging covering plate and the substrate;
the water-absorbing layer is arranged between the organic film and the inorganic film, and is completely wrapped by the organic film and the inorganic film.

2. The packaging structure according to claim 1, wherein the water-absorbing layer comprises a base layer and a moisture absorbent located in the base layer.

3. The packaging structure according to claim 2, wherein a material of the base layer is the same as or different from a material of the encapsulant layer.

4. The packaging structure according to claim 1, wherein the water-absorbing layer is provided with a plurality of grooves, the water-absorbing layer is divided into a plurality of water-absorbing regions spaced apart by the grooves, and the grooves are filled with sealant.

5. The packaging structure according to claim 1, wherein the light-emitting unit is an Organic Light-Emitting Diode (OLED) or a Quantum-dot Light-Emitting Diode (QLED).

6. A display component, comprising the packaging structure according to claim 1.

7. A display device, comprising the display component according to claim 6.

8. A packaging structure, comprising:
a substrate;
a light-emitting unit arranged on the substrate;
a packaging layer, by which the light-emitting unit is packaged on the substrate; and
a water-absorbing layer which is arranged in the packaging layer and completely wrapped by the packaging layer,
wherein the packaging layer comprises:
a multi-layer composite packaging film covering the light-emitting unit; wherein the multi-layer composite packaging film comprises at least one organic film and at least two inorganic films; the organic film and the inorganic films are arranged alternately; and an encapsulant layer covering the multi-layer composite packaging film;

the packaging layer further comprises a packaging covering plate, and the encapsulant layer is adhered between the packaging covering plate and the substrate;

the water-absorbing layer has two layers, wherein one layer of the water-absorbing layer is arranged between the organic film and the inorganic film, and is completely wrapped by the organic film and the inorganic film, and the other layer of the water-absorbing layer is arranged on a surface of the packaging covering plate facing the substrate, and is completely wrapped by the packaging covering plate and the encapsulant layer.

9. A packaging structure, comprising:

a substrate;

a light-emitting unit arranged on the substrate;

a packaging layer, by which the light-emitting unit is packaged on the substrate; and a water-absorbing layer which is arranged in the packaging layer and completely wrapped by the packaging layer, wherein the water-absorbing layer is provided with a plurality of grooves, the water-absorbing layer is divided into a plurality of water-absorbing regions spaced apart by the grooves, and the grooves are filled with sealant.

* * * * *